(12) United States Patent
Lu et al.

(10) Patent No.: US 9,373,551 B2
(45) Date of Patent: Jun. 21, 2016

(54) MOVEABLE AND ADJUSTABLE GAS INJECTORS FOR AN ETCHING CHAMBER

(71) Applicant: Taiwan Semiconductor Manufacturing Co., Ltd., Hsin-Chu (TW)

(72) Inventors: Tzung-Shiun Lu, Tainan (TW); Chun-Lang Chen, Madou Township (TW); Shih-Hao Yang, Tainan (TW); Jong-Yuh Chang, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 74 days.

(21) Appl. No.: 14/089,783

(22) Filed: Nov. 26, 2013

(65) Prior Publication Data

US 2014/0273301 A1    Sep. 18, 2014

Related U.S. Application Data

(60) Provisional application No. 61/777,282, filed on Mar. 12, 2013.

(51) Int. Cl.
*H01J 37/32* (2006.01)
*C23C 16/455* (2006.01)
*H01L 21/66* (2006.01)

(52) U.S. Cl.
CPC .............. *H01L 22/12* (2013.01); *C23C 16/455* (2013.01); *C23C 16/45587* (2013.01); *C23C 16/45589* (2013.01); *H01J 37/3244* (2013.01); *H01J 37/32091* (2013.01); *H01J 37/3299* (2013.01); *H01L 22/26* (2013.01); *H01J 2237/334* (2013.01)

(58) Field of Classification Search
CPC ..... H01L 22/12; H01L 22/26; H01J 37/3244; H01J 37/32091; H01J 37/3299; H01J 2237/334; C23C 16/455; C23C 16/45587; C23C 16/45589
See application file for complete search history.

(56) References Cited

U.S. PATENT DOCUMENTS

| | | | | |
|---|---|---|---|---|
| 5,795,831 | A  * | 8/1998 | Nakayama | ........ H01L 21/31138 156/345.36 |
| 6,143,125 | A | 11/2000 | Shoji | |
| 6,390,106 | B1 * | 5/2002 | Lin | ..................... B05B 13/0468 134/172 |
| 6,527,911 | B1 | 3/2003 | Yen et al. | |

(Continued)

FOREIGN PATENT DOCUMENTS

WO    2005008333 A2    1/2005

*Primary Examiner* — Jeffrie R Lund
(74) *Attorney, Agent, or Firm* — Duane Morris LLP

(57) ABSTRACT

An apparatus for increasing the uniformity in a critical dimension of chemical vapor deposition and etching during substrate processing, comprising a plurality of gas injectors for admitting a processing gas into an etching chamber. Each gas injector of the plurality of gas injectors is disposed along a track within the etching chamber and moveable along the track. Further, each gas injector is coupled with a throttling valve or nozzle to permit adjustment of processing gas flow rate. A method for increasing the uniformity in a critical dimension of chemical vapor deposition and etching during substrate processing includes performing a chemical deposition or etch using the plurality of moveable and adjustable gas injectors and measuring the critical dimension uniformity. Adjustments to the location of at least one gas injector or the processing gas flow rate to at least one gas injector are made to increase critical dimension uniformity.

19 Claims, 6 Drawing Sheets

(56) References Cited

U.S. PATENT DOCUMENTS

| | | | |
|---|---|---|---|
| 7,062,411 B2 | 6/2006 | Hopkins et al. | |
| 7,820,243 B2 * | 10/2010 | Yoshihara | G03F 7/162 118/320 |
| 7,897,008 B2 | 3/2011 | Chang et al. | |
| 9,045,826 B2 * | 6/2015 | Seo | C23C 16/45551 |
| 2003/0230323 A1 * | 12/2003 | You | B08B 3/02 134/33 |
| 2005/0133616 A1 * | 6/2005 | Shimoda | H01L 51/0005 239/135 |
| 2005/0211162 A1 * | 9/2005 | Osawa | B05B 3/028 118/300 |
| 2005/0263170 A1 * | 12/2005 | Tannous | B08B 5/02 134/1.1 |
| 2007/0098901 A1 * | 5/2007 | Terada | H01L 21/02123 427/335 |
| 2009/0087559 A1 * | 4/2009 | Yoshihara | G03F 7/162 427/240 |
| 2010/0146813 A1 * | 6/2010 | Jeong | H01L 21/02057 34/519 |
| 2011/0146572 A1 * | 6/2011 | Yoshihara | H01L 21/6715 118/697 |
| 2011/0293831 A1 * | 12/2011 | Sferlazzo | C23C 16/45565 427/255.28 |
| 2013/0071567 A1 * | 3/2013 | Hsiao | C23C 16/45589 427/255.28 |
| 2013/0072000 A1 * | 3/2013 | Hsiao | C23C 16/46 438/478 |
| 2013/0239887 A1 * | 9/2013 | Yoshihara | G03F 7/162 118/697 |
| 2013/0266728 A1 * | 10/2013 | Seo | C23C 16/45551 427/255.28 |
| 2013/0270362 A1 * | 10/2013 | Sferlazzo | C23C 16/455565 239/225.1 |
| 2013/0280643 A1 | 10/2013 | Hsu et al. | |
| 2013/0312659 A1 * | 11/2013 | Inatomi | G03F 7/40 118/66 |
| 2013/0323422 A1 * | 12/2013 | Peidous | C23C 16/405 427/255.7 |
| 2014/0272716 A1 * | 9/2014 | Lai | G03F 7/0045 430/319 |
| 2014/0273301 A1 * | 9/2014 | Lu | H01L 22/12 438/14 |

* cited by examiner

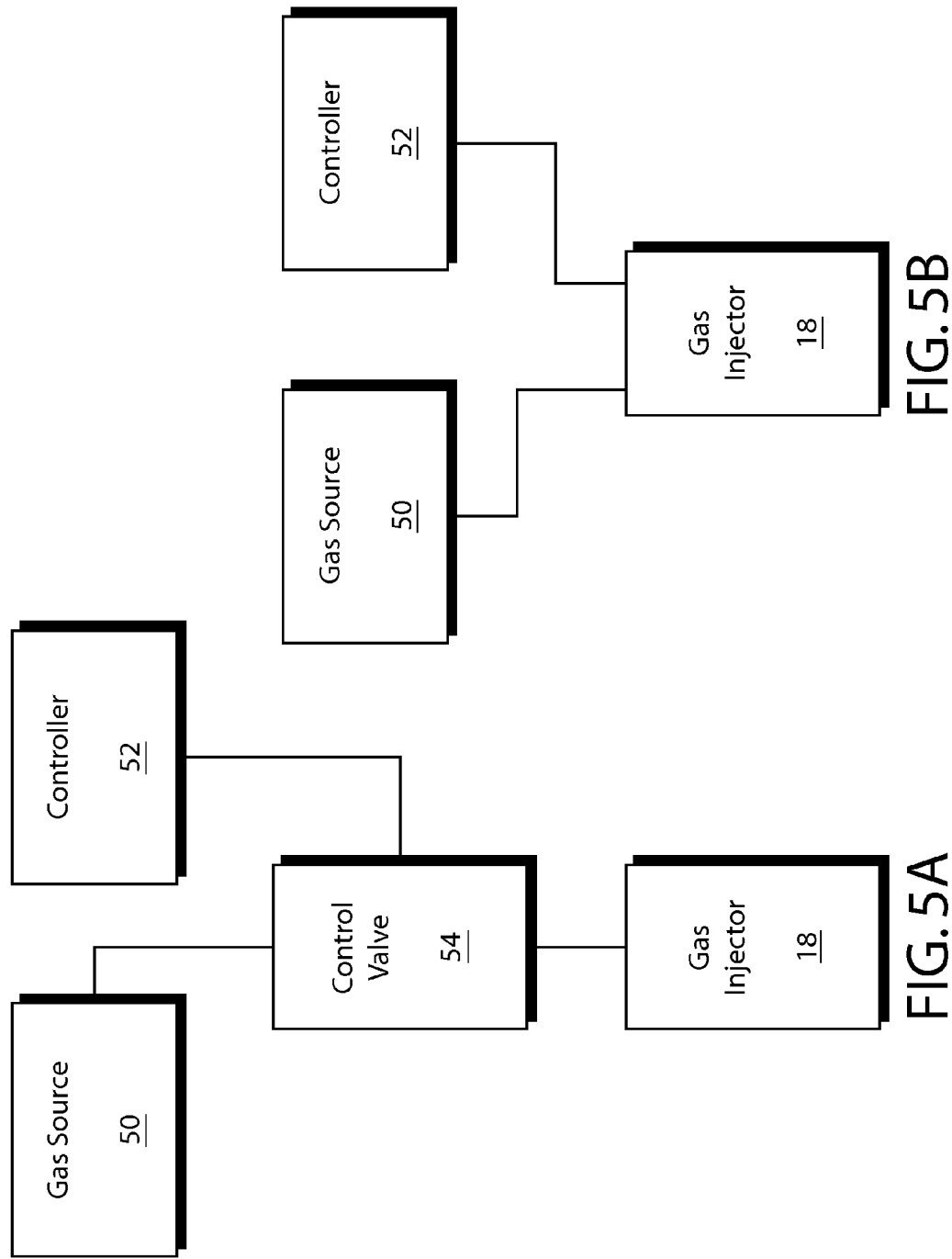

MOVEABLE AND ADJUSTABLE GAS INJECTORS FOR AN ETCHING CHAMBER

CROSS-REFERENCE TO RELATED APPLICATIONS

This application claims the benefit of U.S. Provisional Application Ser. No. 61/777,282, filed Mar. 12, 2013, which is expressly incorporated herein by reference in its entirety

FIELD

The present disclosure generally relates to semiconductor fabrication. More particularly, the present disclosure relates to gas injectors used in the etching chambers of semiconductor fabrication equipment.

BACKGROUND

A photomask is used during the manufacture of an integrated circuit (IC) to transfer the design of each chip layer onto a semiconductor substrate. Since a photomask contains the pattern for a single layer of the chip, a set of 15 to 30 photomasks is typically used in the construction of a chip. Photomasks are reusable and typically comprise a substrate, a reflective layer, and an absorber layer.

Extreme ultraviolet (EUV) lithography is a promising new patterning technology for producing very small (i.e. ~14 nm) chips. EUV lithography, like optical lithography, uses a set of photomasks which reflect EUV light to form a patterned photoresist on a semiconductor substrate.

Photomasks for EUV lithography are generally manufactured by etching the chip layer pattern into the photomask. This process has a low tolerance for error, since any defects in the photomask will be transferred to the semiconductor substrate during EUV lithography. To manufacture a photomask, a substrate (e.g., quartz) is typically etched in an etching chamber wherein a photomask can be exposed to various processing gasses and plasmas.

Within the etching chamber it is desired to achieve a uniform distribution of gas to ensure proper etching of the substrate. Uniformity of gas distribution is affected by the internal dynamics of a plasma etching chamber. Uneven gas distribution within the chamber creates unwanted variations in substrate fabrication, known as "process fingerprints." These process fingerprints can damage device structures, leading to degraded chip performance or, in extreme cases, an unusable chip.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like numerals denote like features throughout specification and drawing.

FIG. 5A is a connection diagram of a moveable and adjustable gas injector in accordance with some embodiments.

FIG. 5B is a connection diagram of a moveable and adjustable gas injector in accordance with some embodiments.

DETAILED DESCRIPTION

Figure 1:
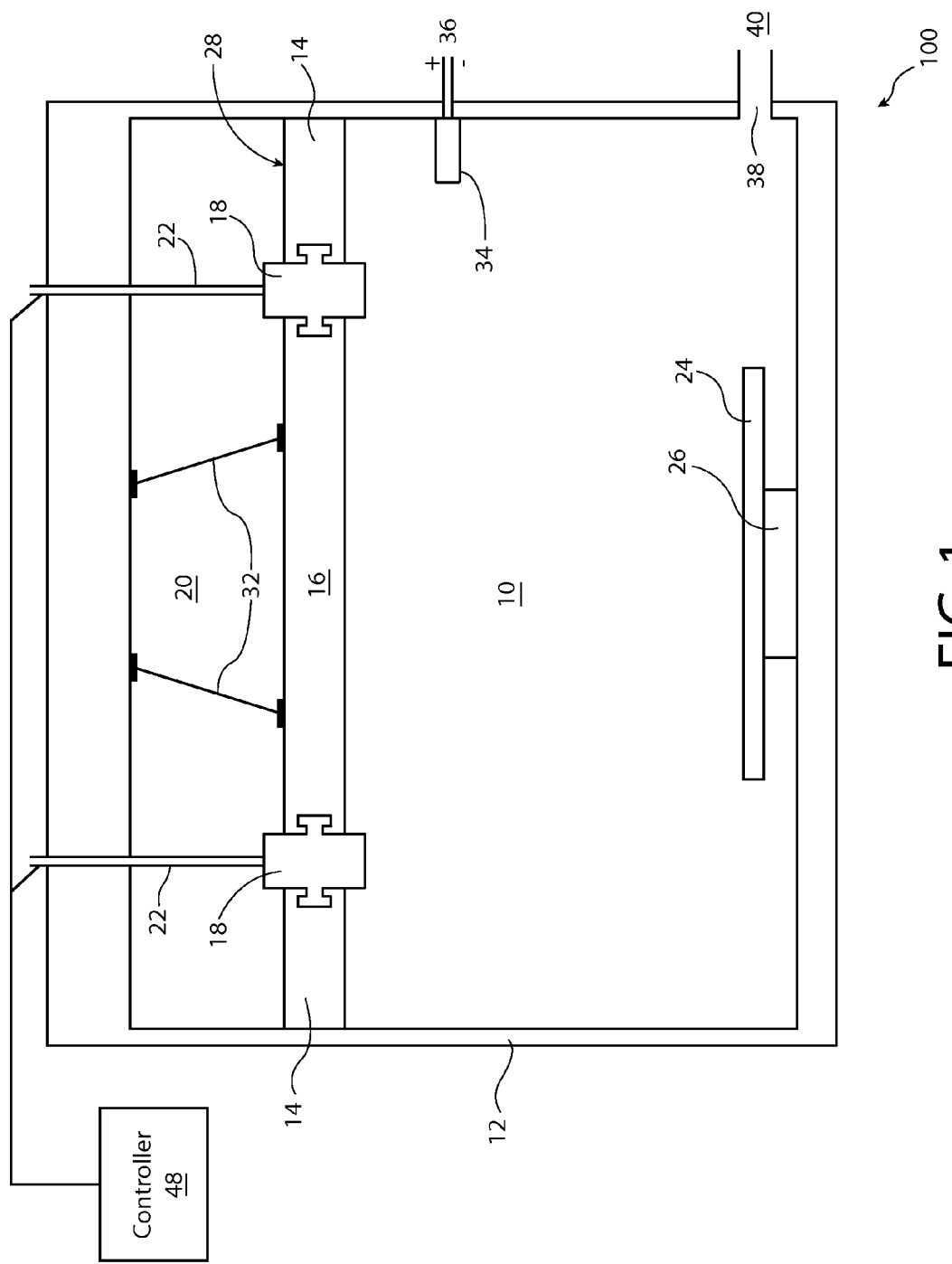
FIG. 1 is a schematic cross-section view of an etching chamber containing moveable and adjustable gas injectors in accordance with some embodiments of the present disclosure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The present disclosure provides an apparatus comprising a plurality of gas injectors moveably connected to a track fitted within an etching chamber. In some embodiments, the track is circular. A method is disclosed comprising performing an etch on a substrate using a plurality of moveable and adjustable gas injectors and measuring the uniformity of a critical dimension (CD) of the substrate. The apparatus and method are provided to adjust the location and flow rate of processing gases admitted to the etching chamber, which will increase uniformity of gas distributed or plasma formed within the etching chamber and ultimately increase the uniformity of substrates etched within the chamber.

FIG. 1 is a schematic cross-section view of one example of an etching chamber 100 containing a plurality of gas injectors 18 in accordance with some embodiments of the present disclosure. In some embodiments, as shown in FIG. 1, the exemplary etching chamber 100 is generally cylindrical in shape with the etching chamber housing 12 forming an upper chamber cavity 20 and lower chamber cavity 10.

A substrate 24 which is to undergo etching rests on a pedestal 26 within the lower chamber cavity 10. In some embodiments, the substrate 24 is a rectangular quartz substrate for a photomask, over which a MoSi multi-layer reflector and a chrome or tantalum absorber are to be formed. In other embodiments, the substrate 24 is a circular semiconductor wafer.

The pedestal 26 is connected to the etching chamber housing 12. In some embodiments, the etching chamber 100 is generally rectangular in shape.

Fitted within and connected to etching chamber housing 12 is a gas injector module 28. The gas injector module 28 is a gas distribution apparatus, configured to provide processing gas into the lower chamber cavity 10 of etching chamber 100. The gas injector module comprises an inner track 16, outer track 14, and a plurality of gas injectors 18. Gas injector module 28 divides the etching chamber 100 into an upper chamber cavity 20 and lower chamber cavity 10. Outer track 14 is connected to etching chamber housing 12. Inner track 16 is connected to the etching chamber housing 12 by at least one support bracket 32. A plurality of gas injectors 18 are disposed between the inner track 16 and outer track 14 in a manner that allows the injector's locations to be adjusted by moving the injectors 18 laterally along the track. In the example, gas injector module 28 is disposed over pedestal 26. In other embodiments, the etching chamber 100 is oriented horizontally (i.e., rotated 90 degrees from the position in FIG. 1).

Each gas injector 18 is connected to a flexible hose 22 which passes through etching chamber housing 12 and provides at least one chemical in a gas state from a gas source located outside the etching chamber 100. In some embodiments, the gas source provides two or more chemicals in a gas state. Electrical wiring for communicating with a gas injector 18 can also be run alongside flexible hose 22. This wiring connects each gas injector with a first controller 48.

Etching chamber housing 12 includes at least one exhaust port 38 connecting to at least one vacuum chamber 40. During most uses of etching chamber 100, a vacuum is formed in the etching chamber 100 and desorbed species formed during the etching process are expelled via exhaust port 38.

In some embodiments, etching chamber 100 additionally includes at least one electrode 34, which is connected to a high frequency electric power supply 36. In some embodiments, processing gases admitted to the etching chamber 100 contact the energized electrode to form plasma for a plasma etching process.

In some embodiments, pedestal 26 comprises an electrostatic chuck, vacuum system, clamp or other apparatus that is able to fix the substrate 24 on the pedestal 26. The etching chamber 100 can be used to perform a gas etch or a plasma etch on a mask, wafer, or similar workpiece. In some embodiments, pedestal 26 further comprises a bottom electrode coupled to a power supply to enhance plasma within the etching chamber 100. Alternatively, pedestal 26 is electrically grounded. In some embodiments, pedestal 26 includes a plurality of support pins and the substrate 24 rests on the support pins during processing. In some embodiments, pedestal 26 comprises a heater (not shown) for heating the substrate 24. The substrate 24 can be also heated by radiant heating through a quartz window (not shown) at the bottom of etching chamber 100.

In FIGS. 2 through 5, like items are indicated by like reference numerals, and for brevity, descriptions of the structure, provided above with reference to FIG. 1, are not repeated.

Figure 2:
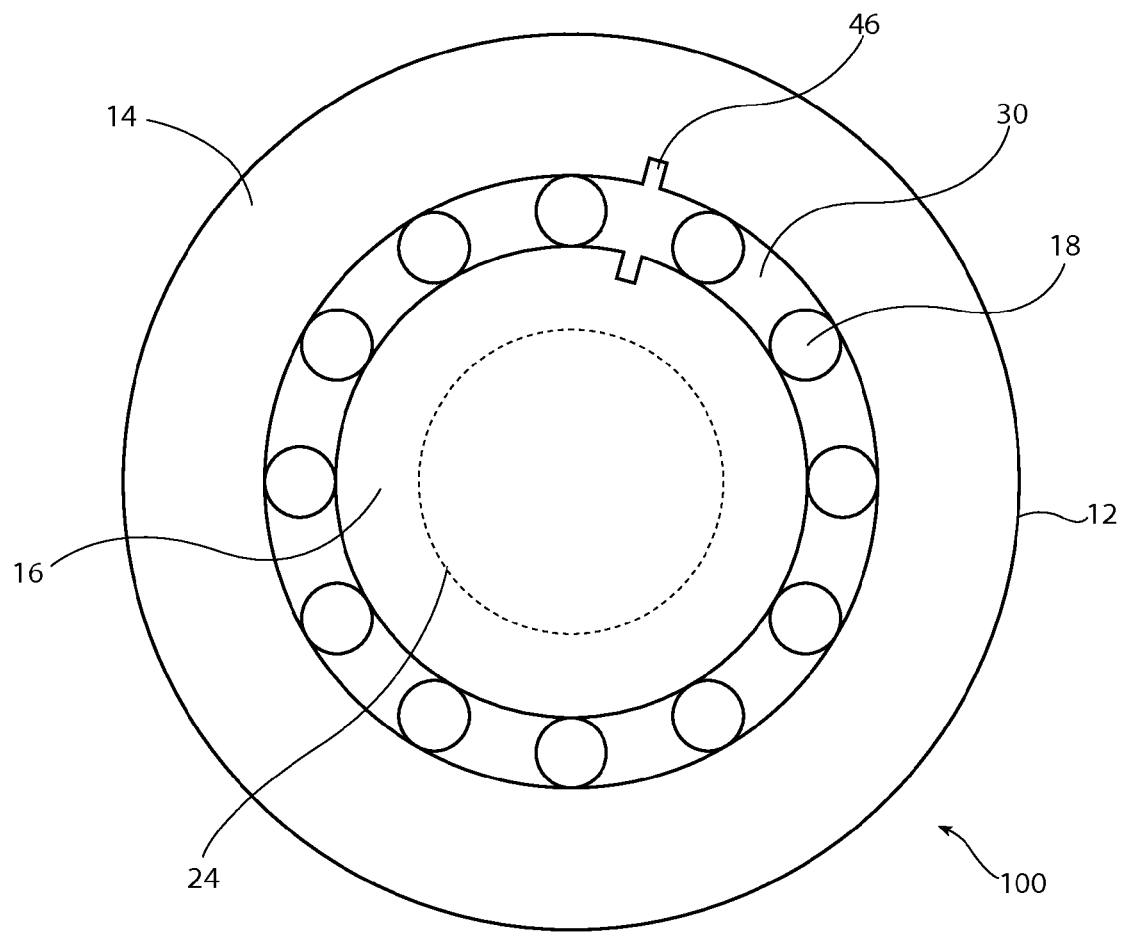
FIG. 2 is a top schematic view of a gas injector module within an etching chamber in accordance with some embodiments of the present disclosure.

FIG. 2 is a top schematic view of a gas injector module 28 within an etching chamber 100 in accordance with some embodiments of the present disclosure. The plurality of gas injectors 18 are disposed in a circular formation between inner track 16 and outer track 14. Outer track 14 is connected to the etching chamber housing 12. Each of the plurality of gas injectors is moveable along the circular track formed by inner track 16 and outer track 14. For illustrative purposes, a substrate 24 is pictured within the lower chamber cavity 10, centered beneath the plurality of gas injectors 18.

By way of example, FIG. 2 illustrates twelve gas injectors 18 disposed within a circular track. The gas injectors 18 are shown evenly spaced along the track, with a gap 30 between each gas injector 18 and the adjacent gas injector 18. A slot 46 which is used to insert or remove gas injectors 18 to achieve a desirable number of gas injectors 18 within etching chamber 100. As would be apparent to one of ordinary skill in the art, there are many variations on this configuration. For example, some embodiments can have more or fewer gas injectors 18. Some embodiments can feature the gas injectors 18 disposed in several tracks aligned in rows or any number of additional shapes. As described in further detail below, some embodiments can also have the gas injectors 18 disposed at non-uniform distances from each other along the track.

Figure 3:
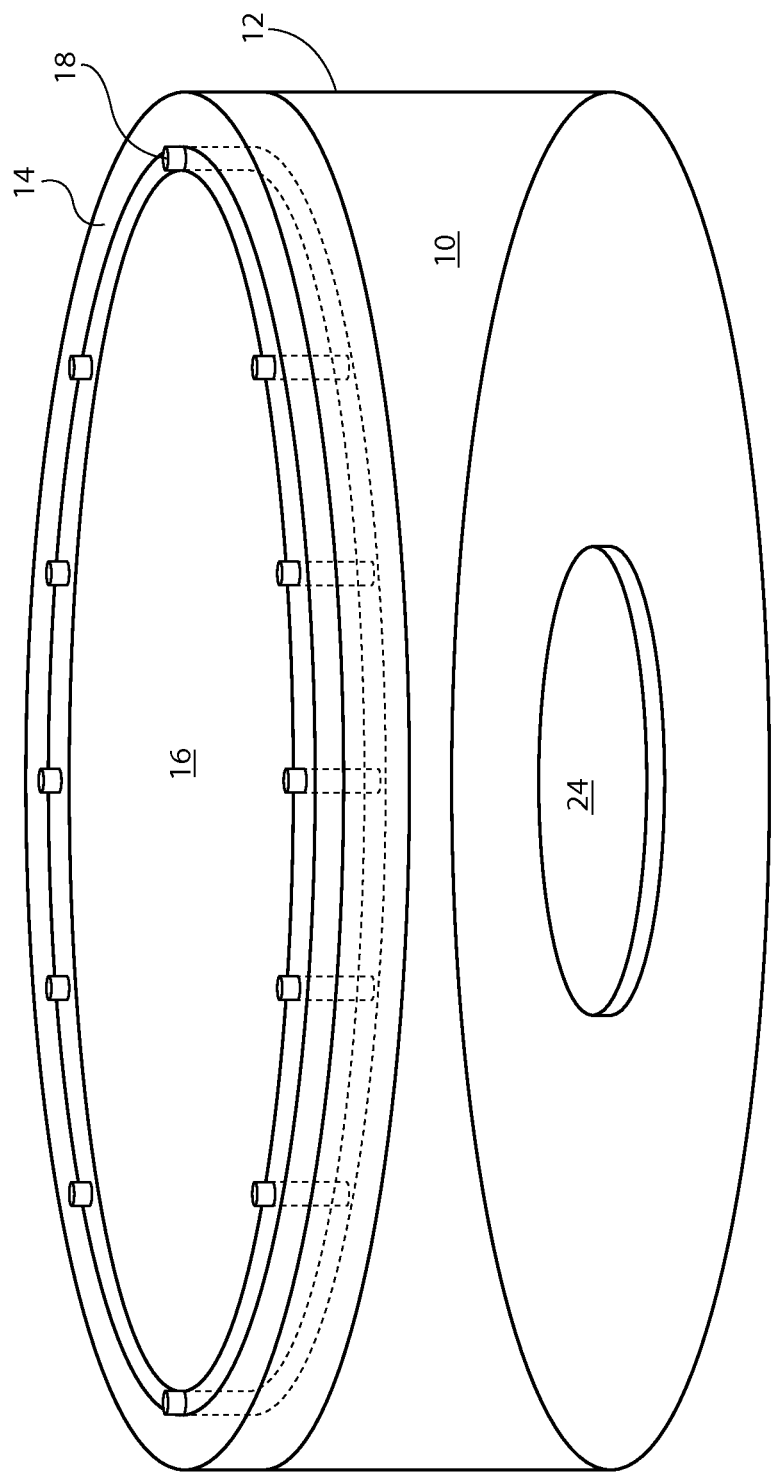
FIG. 3 is an elevated side schematic view of an etching chamber containing moveable and adjustable gas injectors in accordance with some embodiments of the present disclosure.

FIG. 3 is an elevated side schematic view of an etching chamber 100, with the top portion of the chamber removed for illustrative purposes, in accordance with some embodiments of the present disclosure. FIG. 3 further illustrates the configuration of the plurality of gas injectors 18, inner track 16, outer track 14, and etching chamber housing 12 as described above and as illustrated in FIGS. 1 and 2. A substrate 24 is again pictured within the lower chamber cavity 10.

Figure 4A:
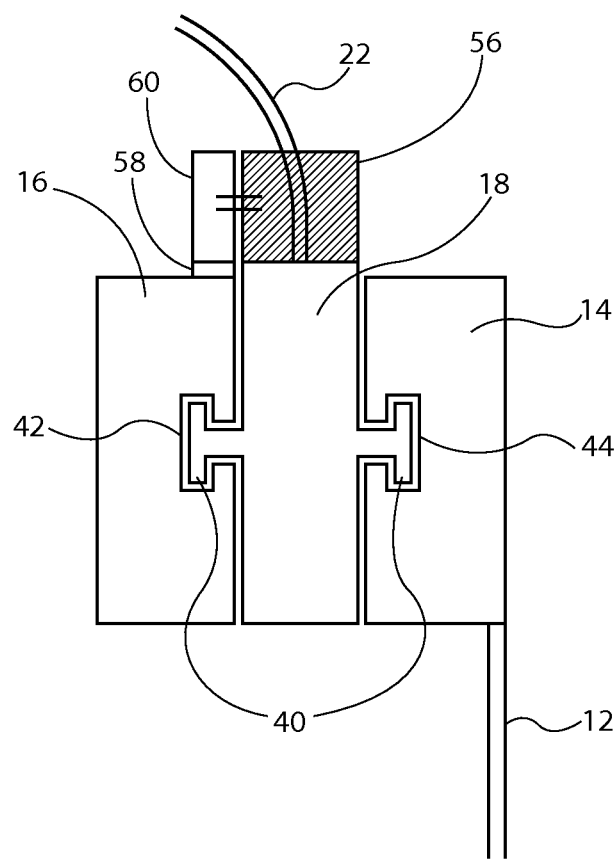
FIG. 4A is a schematic cross-section view of a moveable and adjustable gas injector within a track in accordance with some embodiments of the present disclosure.

FIG. 4A is a schematic cross-section view of a gas injector 18 disposed within the track according to some embodiments of the present invention. A pair of protruding members 40 extend from gas injector 18. Protruding members 40 are configured to slide laterally within a corresponding inner track groove 42 and outer track groove 44. Protruding members 40 additionally serve to hold gas injector 18 securely within the gap 30 formed by inner track 16 and outer track 14. Protruding members 40 can assume a variety of shapes and sizes. In some embodiments, protruding members 40 are small wheels that facilitate smooth lateral motion of the gas injector 18 along the track.

Figure 4B:
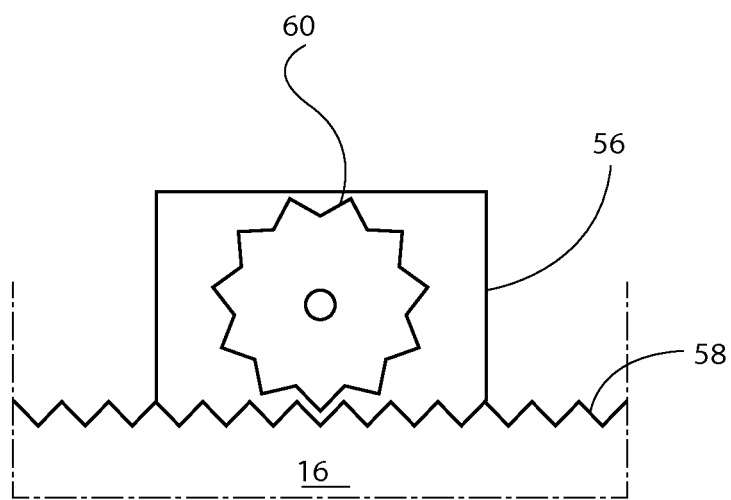
FIG. 4B is a schematic side view of a stepper motor gear of a moveable and adjustable gas injector engaged with a toothed track in accordance with some embodiments of the present disclosure

FIG. 4A further illustrates the means for changing the location of a gas injector 18. Each gas injector 18 is topped with a stepper motor 56 which comprises multiple toothed electromagnets arranged around a central gear. Stepper motor 56 is mechanically connected to a toothed wheel 60, which is engaged with a row of teeth 58 disposed along the edge of inner track 16. FIG. 4B further illustrates the engagement of toothed wheel 60 and teeth 58. Stepper motor 56 receives signals from first controller 48 to change or maintain its location.

In some embodiments, each adjustable gas injector 18 is suspended from an actuator comprising a worm drive (not pictured). For example, the track can have a worm (which is a gear in the form of a threaded member), and the actuator has a worm gear that meshes with the worm on the track. Each actuator has an independently operable, reversible motor for rotating that actuator's worm gear, causing the actuator to move along the track.

The interior of a plasma chamber is a highly corrosive environment. As such, the components described herein are preferably constructed of materials which resist corrosion. For example, the plurality of gas injectors 18 can be made of ceramic. The inner track 16 and outer track 14 can be made of metal with a protective, anti-corrosive coating. Other suitable materials include anodized aluminum, aluminum alloy, ceramic, and other corrosion resistant materials.

FIGS. 5A and 5B are connection diagrams of the processing gas supply system of the disclosed apparatus according to some embodiments. As described above, the disclosed apparatus is an adjustable gas injector in that it can control the flow rate of a chemical in a gas state to be used for creating plasma within the etching chamber 100. In some cases, the flow rate of processing gas into the chamber is varied to allow for more uniform gas distribution or more uniform plasma formation and distribution.

In FIG. 5A, the flow rate is controlled by a control valve 54 which is connected to a gas source 50. Control valve 54 is an electronically-controlled throttle valve that is connected electronically to second controller 52. Second controller 52 sends signals, also referred to as orders, via the electric connection ordering changes in processing gas flow rate for the associated gas injector 18, and control valve 54 adjusts the processing gas flow rate accordingly via throttling. If needed or desired, the control valve 54 can also be completely shut to secure all processing gas flow.

In FIG. 5B, the flow rate is controlled directly at the gas injector 18 by second controller 52. Gas injector 18 is connected to gas source 50 and electrically connected to second controller 52. Gas injector 18 can contain an internal throttle valve, adjustable nozzle, or other means of controlling processing gas flow rate. Second controller 52 sends signals via the electric connection ordering changes in processing gas flow rate for the associated gas injector 18, and gas injector 18 adjusts the processing gas flow rate accordingly. If needed or desired, the gas injector 18 can also be completely shut to secure all processing gas flow.

In still further embodiments, second controller 52 is electrically connected to both a control valve 54 and gas injector 18, with one serving as a primary means for controlling processing gas flow rate and the other serving as a secondary or back-up means.

A single second controller 52 is provided to control the processing gas flow rates at each of the plurality of gas injectors 18. In some embodiments, a plurality of second controllers 52 are provided, each of the plurality of second controllers 52 associated with one of the plurality of gas injectors 18. Second controller 52 can be connected to a human-machine interface, such as a computer or a control panel, or it can be operated automatically by a semiconductor manufacturing computer that controls the etching process. The second controller 52 can be, for example, a central processing unit (CPU), a microprocessor, a programmable logic control unit, a computer or other device or system that is adapted to control respective processing gas flow rate in respective gas injectors 18.

First controller 48 controls the location of each of the plurality of gas injectors 18. Second controller 52 controls the processing gas flow rates at each of the plurality of gas injectors 18. In some embodiments, first controller 48 and second controller 52 are combined into a single controller which can be, for example, a central processing unit (CPU), a microprocessor, a programmable logic control unit, a computer or other device or system that is adapted to control the location and respective processing gas flow rate in respective gas injectors 18.

First controller 48 and second controller 52 include a user interface, allowing a worker using the etching chamber described herein to control the location and processing gas flow rate of the plurality of gas injectors. The worker monitors uniformity of a critical dimension (CD) as substrates are processed and adjusts the location and/or the processing gas flow rate to improve CD uniformity.

Monitoring of the CD is performed on every substrate following processing in the plasma chamber, or is performed at various intervals. Monitoring the CD uniformity of substrates as they are processed allows a worker to establish processing trends and adjust system parameters accordingly. In some embodiments, monitoring of the CD is performed in situ, without removing the substrate from the etching chamber. Thus, the location and professing gas flow rate of the plurality of gas injectors can be dynamically adjusted as the substrate is etched.

Figure 6:
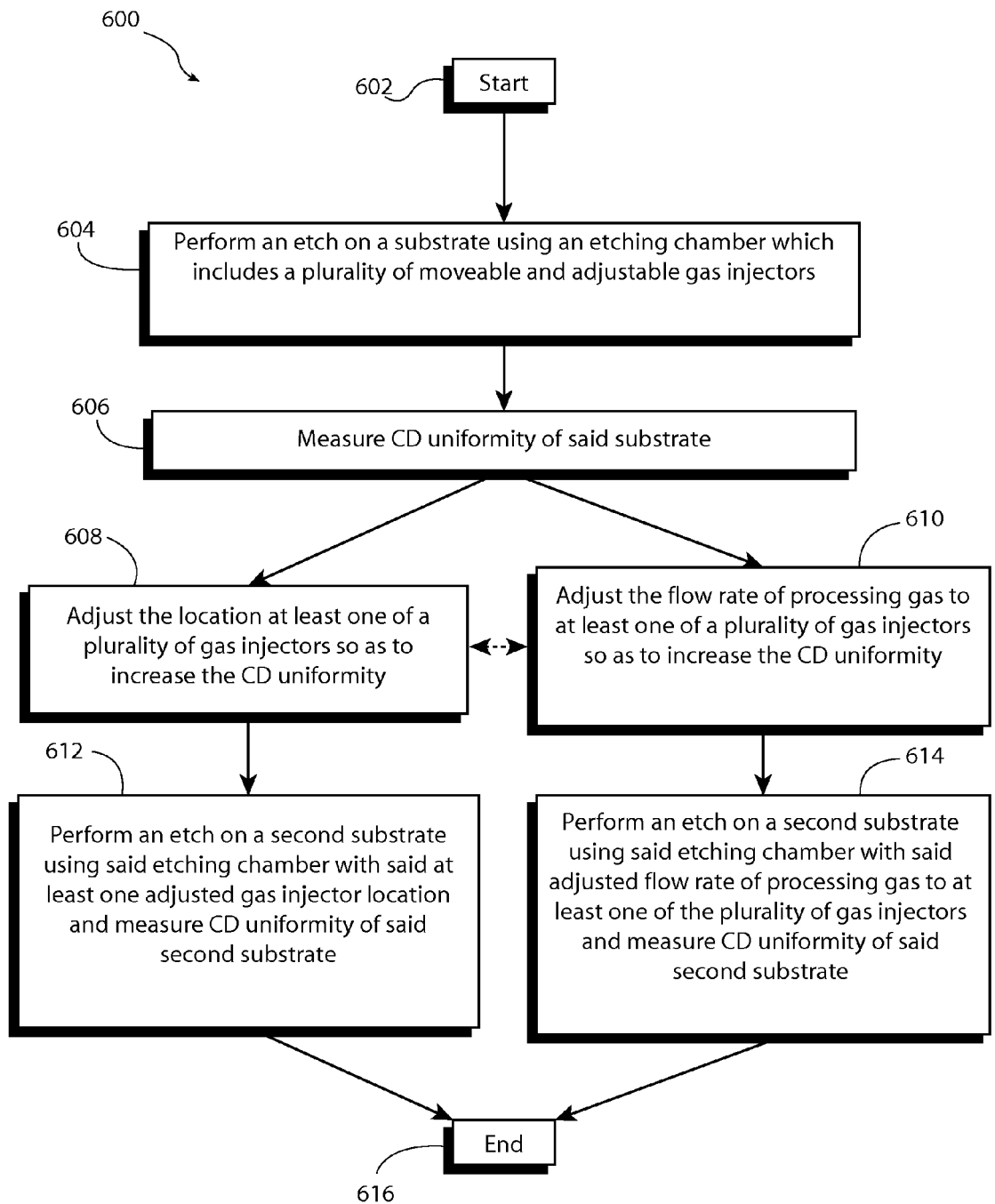
FIG. 6 is a flow diagram of a method in accordance with some embodiments.

The present disclosure further provides a method for increasing the CD uniformity during substrate processing. FIG. 6 is a flow diagram of a method in accordance with some embodiments. After process 600 begins at block 602, a first etch is performed on a first substrate using an etching chamber which includes a plurality of moveable and adjustable gas injectors at block 604. At block 606, the CD uniformity of the first substrate is measured. As would be known to one of skill in the art, various dimensions of the substrate can be measured when performing the disclosed method. CD uniformity is used herein for illustrative purposes; however, the disclosed method is not limited to measuring and adjusting for CD uniformity.

At block 608, the location of at least one of the plurality of gas injectors is adjusted to increase CD uniformity. At block 610, the flow rate of processing gas to at least one of the plurality of gas injectors is adjusted to increase CD uniformity. In some embodiments, the location of a gas injector can be adjusted, the flow rate of processing gas to a gas injector can be adjusted, or both the location and flow rate of processing gas to a gas injector can be adjusted to at least one gas injector.

At blocks 612 and 614, following adjustments made at blocks 608 and 610, a second etch of a second substrate is performed and the CD uniformity is measured. The process ends at block 616.

The moveable and adjustable gas injectors described above have several advantages. First, the uniformity of gas or plasma distribution can be improved by relocating each of a plurality of gas injectors along a circular track within the etching chamber. Second, gas and plasma uniformity can also be improved by adjusting the flow rate of source gases entering the etching chamber. As a result, a more uniform gas or plasma distribution is achieved within the etching chamber, and the etching process performed on a substrate is more uniform thus increasing the CD uniformity.

The moveable and adjustable gas injectors described above are applicable to the manufacture of photomasks, such as those used in optical lithography, EUV lithography, electron projection lithography, ion projection lithography, X-ray lithography, or nanoimprint. The various embodiments of moveable and adjustable gas injectors described above are also generally applicable to a variety of other processes, such as but not limited to, plasma etching, chemical vapor deposition (CVD), plasma enhanced CVD (PECVD), physical vapor deposition (PVD) or atomic layer deposition (ALD) and other semiconductor fabrication processes. Examples of related applications include but are not limited to formation of films of shallow trench isolation (STI), advanced patterned film/antireflective coating (APF/ARC) oxide, and low dielectric constant materials.

The processing gas can be, for example, a pure chemical gas, a mixed chemical gas, a mist or moisture of chemical, an ionized gas comprising plasma, a mixture of gas comprising liquid drops, or any other type of chemicals suitable for a semiconductor process for deposition or etching. Substrate 24 can be, for example, a photomask, a semiconductor wafer, a silicon substrate, a III-V semiconductor compound, a glass substrate, a liquid crystal display (LCD) substrate, or any other suitable substrate. In some embodiments, substrate 24 is a blank substrate or comprises a variety of integrated devices or circuits, or layers of forming such devices or circuits.

Although examples are illustrated and described herein, embodiments are nevertheless not limited to the details shown, since various modifications and structural changes can be made therein by those of ordinary skill within the scope and range of equivalents of the claims.

In some embodiments, an apparatus comprises an etching chamber for delivering a processing gas to a substrate within the etching chamber; a track within the etching chamber; and a plurality of gas injectors for admitting a processing gas into the etching chamber, each gas injector disposed along the track within said etching chamber and moveable along said track.

In some embodiments each respective gas injector is coupled to a respective valve to allow the adjustment of a flow rate of a processing gas.

In some embodiments apparatus further comprises a plurality of flexible hoses connected to the plurality of gas injectors for supplying a processing gas to the gas injectors.

In some embodiments the plurality of gas injectors are disposed within an inner track and an outer track and moveable within the gap bounded by the inner track and the outer track and each gas injector of the plurality of gas injectors has at least one protruding member configured to slide laterally within a track groove.

In some embodiments the apparatus further comprises a controller for controlling the respective flow rate of the processing gas through each respective one of the plurality of gas injectors; an electric connector from said controller to said gas injector valve; and a source of the processing gas.

In some embodiments each gas injector has a respective actuator, including a respective motor and a respective gear, configured to move that gas injector along the track.

In some embodiments, an apparatus comprises an etching chamber housing defining a chamber cavity; a gas injector module mounted within the chamber cavity, the gas injector module comprising a plurality of plurality of gas injectors disposed within an inner track and an outer track and moveable within the gap bounded by the inner track and the outer track.

In some embodiments each respective gas injector is coupled to a respective valve to allow the adjustment of the flow rate of a processing gas.

In some embodiments the apparatus further comprises a plurality of flexible hoses connected to the plurality of gas injectors for supplying a processing gas to said gas injectors.

In some embodiments each gas injector of the plurality of gas injectors has at least one protruding member configured to slide laterally within a track groove.

In some embodiments the apparatus further comprises a controller for controlling the respective flow rate of the processing gas through each respective one of the plurality of gas injectors; an electric connector from the controller to the gas injector valve; and a source of the processing gas.

In some embodiments each gas injector has a respective actuator, including a respective motor and a respective gear, configured to move that gas injector along the track.

In some embodiments the apparatus further comprises a controller which controls the location of the gas injector by sending orders to the actuator and the motor.

In some embodiments, a method comprises the steps of performing a first etch on a first substrate using an etching chamber which includes a plurality of moveable and adjustable gas injectors; measuring a dimension at a plurality of locations on the first substrate; and adjusting at least one of a position or a gas flow rate of at least one of the adjustable gas injectors based on the measuring.

In some embodiments the measuring a dimension is performed without removing the first substrate from the etching chamber.

In some embodiments the adjusting step includes adjusting either the location of at least one of a plurality of gas injectors or the flow rate of processing gas to at least one of a plurality of gas injectors so as to increase uniformity of the measured dimension.

In some embodiments the adjusting step is performed dynamically while the substrate in undergoing etching.

In some embodiments the adjusting step is performed automatically by a controller.

In some embodiments the method further comprises performing a second etch on a second substrate after adjusting either the location of at least one of a plurality of gas injectors or the flow rate of processing gas to at least one of a plurality of gas injectors; and measuring the dimension at a plurality of locations on the second substrate.

In some embodiments the method further comprises adjusting the location at least one of a plurality of gas injectors so as to increase uniformity of the dimension; adjusting the flow rate of processing gas to at least one of a plurality of gas injectors so as to increase the uniformity of the dimension; performing a second etch on a second substrate using the plurality of gas injectors with at least one adjusted gas injector location and at least one adjusted flow rate of processing gas; and measuring the dimension at a plurality of locations on the second substrate.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although examples are illustrated and described herein, embodiments are nevertheless not limited to the details shown, since various modifications and structural changes can be made therein by those of ordinary skill within the scope and range of equivalents of the claims.

What is claimed is:

1. An apparatus for delivering a processing gas to a substrate, comprising:
   an etching chamber; and
   a circular gas injector module disposed within the etching chamber comprising an inner track, an outer track, and a plurality of gas injectors for admitting the processing gas into the etching chamber, each gas injector independently moveable between said inner track and said outer track.

2. The apparatus of claim 1, wherein each gas injector of said plurality of gas injectors is coupled to a respective valve to allow the adjustment of a flow rate of the processing gas.

3. The apparatus of claim 2, wherein each gas injector of said plurality of gas injectors has at least one protruding member configured to slide laterally within a track groove.

4. The apparatus of claim 2, further comprising:
a controller for controlling the respective flow rate of the processing gas through each respective one of the plurality of gas injectors; and
a source of the processing gas.

5. The apparatus of claim 1 wherein each gas injector has a respective actuator, including a respective motor and a respective gear along said inner track, configured to move that gas injector.

6. An apparatus, comprising: an etching chamber housing defining a chamber cavity; and a circular gas injector module mounted within said chamber cavity, said gas injector module comprising a plurality of gas injectors disposed between an inner track and an outer track and independently moveable within a gap bounded by said inner track and said outer track, each of said plurality of gas injectors having an actuator along said inner track or said outer track configured to move that gas injector.

7. The apparatus of claim 6, wherein each gas injector of said plurality of gas injectors is coupled to a respective gas injector valve to allow the adjustment of the flow rate of a processing gas.

8. The apparatus of claim 7, wherein each gas injector of said plurality of gas injectors has at least one protruding member configured to slide laterally within a track groove.

9. The apparatus of claim 7, further comprising:
a controller for controlling the respective flow rate of the processing gas through each respective one of the plurality of gas injectors;
an electric connector from said controller to said gas injector valve; and
a source of the processing gas.

10. The apparatus of claim 6, further comprising a controller which controls the location of said gas injector by sending orders to said actuator.

11. A system of substrate processing, comprising:
an etching chamber comprising:
an etching chamber housing defining a chamber cavity;
a pedestal mounted within the chamber cavity; and
a circular gas injector module mounted within the chamber cavity comprising a plurality of gas injectors disposed between an inner track and an outer track and independently moveable between said inner track and said outer track, wherein each of the plurality of gas injectors is coupled to one of a plurality of flow rate adjustment valves;
a controller, configured to control the flow rate of a processing gas into the chamber cavity by adjusting the flow rate adjustment valves; and
a processing gas source connected to each of the plurality of gas injectors.

12. The system of claim 11 wherein each gas injector of said plurality of gas injectors has at least one protruding member configured to slide laterally within a track groove.

13. The system of claim 12 wherein each gas injector has a respective actuator, including a respective motor and a respective gear, configured to move that gas injector along the inner track and the outer track.

14. The system of claim 13 wherein the controller controls the location of said gas injector by sending orders to said actuator.

15. The system of claim 14 wherein the inner track and the outer track are each mounted within the chamber cavity by at least one support bracket.

16. The system of claim 11, wherein the etching chamber further comprises at least one electrode mounted within the chamber cavity.

17. The system of claim 11, wherein the etching chamber further comprises at least one exhaust port connected to a vacuum chamber.

18. The system of claim 11, further comprising a user interface connected to the controller.

19. The system of claim 11 wherein the pedestal is electrically grounded.

* * * * *